(12) United States Patent
Robinett

(10) Patent No.: US 7,982,504 B1
(45) Date of Patent: Jul. 19, 2011

(54) INTERCONNECTION ARCHITECTURE FOR MULTILAYER CIRCUITS

(75) Inventor: Warren Robinett, Chapel Hill, NC (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/696,361

(22) Filed: Jan. 29, 2010

(51) Int. Cl.
*H03K 19/00* (2006.01)
(52) U.S. Cl. ............................ 326/103; 326/101; 365/72
(58) Field of Classification Search .......... 326/101–103; 365/63, 72
See application file for complete search history.

(56) References Cited

U.S. PATENT DOCUMENTS

| | | | |
|---|---|---|---|
| 3,318,993 A | 5/1967 | Beelitz | |
| 3,953,924 A | 5/1976 | Zachry et al. | |
| 4,328,531 A | 5/1982 | Nagashima et al. | |
| 4,772,864 A | 9/1988 | Otto et al. | |
| 4,891,789 A | 1/1990 | Quattrini et al. | |
| 4,980,034 A | 12/1990 | Volfson et al. | |
| 5,473,120 A | 12/1995 | Ito et al. | |
| 5,640,761 A | 6/1997 | DiStefano et al. | |
| 5,946,219 A * | 8/1999 | Mason et al. | 716/117 |
| 5,976,393 A | 11/1999 | Abe | |
| 6,256,767 B1 | 7/2001 | Kuekes et al. | |
| 6,525,275 B1 | 2/2003 | Asai | |
| 6,574,113 B2 | 6/2003 | Armezzani et al. | |
| 6,735,104 B2 | 5/2004 | Scheuerlein | |
| 6,836,424 B2 | 12/2004 | Segal et al. | |
| 6,870,264 B2 | 3/2005 | Iwaki et al. | |
| 6,906,940 B1 | 6/2005 | Lue | |
| 6,963,077 B2 | 11/2005 | DeHon et al. | |
| 6,965,137 B2 | 11/2005 | Kinney et al. | |
| 6,992,255 B2 | 1/2006 | Oprysko et al. | |
| 7,112,815 B2 | 9/2006 | Prall | |
| 7,122,746 B2 | 10/2006 | Higuchi et al. | |
| 7,157,305 B2 | 1/2007 | Prall | |
| 7,221,614 B2 | 5/2007 | Saito et al. | |
| 7,292,498 B2 | 11/2007 | Snider | |
| 7,310,004 B2 | 12/2007 | DeHon | |
| 7,342,413 B2 | 3/2008 | Mouttet | |
| 7,352,067 B2 * | 4/2008 | Fukaishi et al. | 257/777 |
| 7,393,739 B2 | 7/2008 | Gopalakrishnan et al. | |
| 7,521,961 B1 * | 4/2009 | Anderson | 326/41 |
| 2005/0063373 A1 | 3/2005 | DeHon et al. | |
| 2005/0167787 A1 | 8/2005 | Fricke et al. | |
| 2006/0240681 A1 | 10/2006 | Williams et al. | |
| 2007/0126474 A1 | 6/2007 | Chang et al. | |
| 2009/0296362 A1 | 12/2009 | Okano | |

OTHER PUBLICATIONS

Strukov, Dmitri B., et al.; "Four-dimensional address topology for circuits with stacked multilayer crossbar arrays"; PNAS; www.pnas.org/cgi/doi/10.1073/pnas.0906949106.

Lee. M.-J., et al.; "Stack Friendly All-Oxide 3D RRAM using GaInZnO Peripheral TFT realized over Glass Substrates"; 2008; pp. 85-88; IEEE.

Herrick, Katherine, et al.; "Interconnects for a Multi-Layer Three-Dimensional Silicon Architecture."

Snider, Gregory S., et al.; "Nano/CMOS architectures using a field-programmable nanowire interconnect"; Nanotechnology; 2007; vol. 18; IOP Publishing Ltd.

* cited by examiner

*Primary Examiner* — James Cho

(57) ABSTRACT

An interconnection architecture for multilayer circuits includes an array of vias and a CMOS layer configured to selectively access the array of vias according to an address. The interconnection architecture also includes a crossbar stack which includes layers of intersecting wire segments with programmable crosspoint devices interposed between intersecting wire segments. The vias are connected to the wire segments such that each programmable crosspoint device is uniquely addressed and every address within a contiguous address space accesses a programmable crosspoint device.

15 Claims, 13 Drawing Sheets

INTERCONNECTION ARCHITECTURE FOR MULTILAYER CIRCUITS

FEDERALLY SPONSORED RESEARCH

This work has been partially funded by the Intelligence Advanced Research Projects Agency (IAEPA) under the Semiconductor-Nanowire Interconnect Project. The United States Government may have rights to this invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
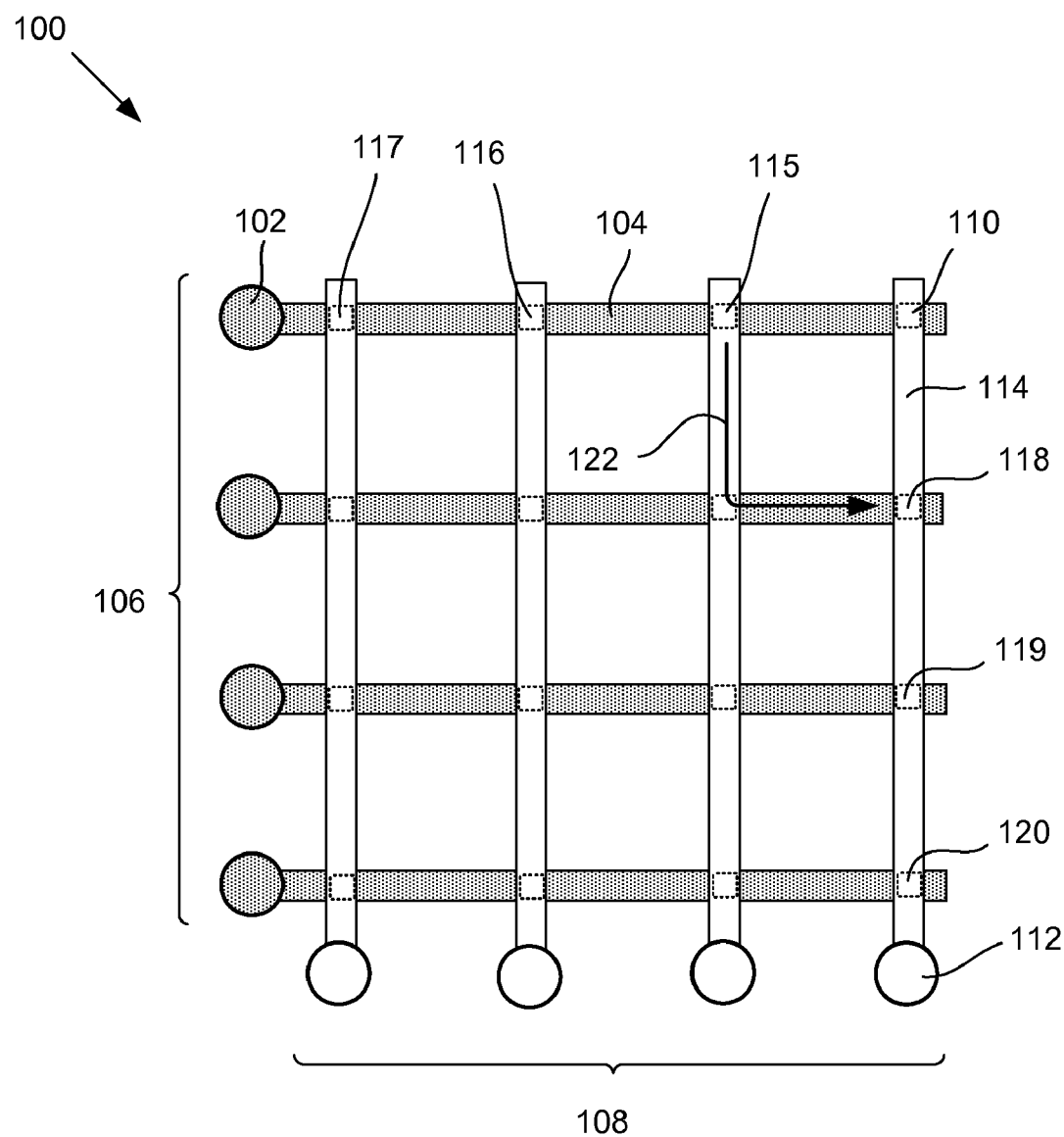
FIGS. 1A-1C are diagrams of an illustrative crossbar circuit, according to one embodiment of principles described herein.

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

New addressing and wiring schemes for multi-layer, memristive crossbar memory are described: the Grove Architecture and the Thicket Architecture. The Grove Architecture includes CMOS-layer digital circuitry, a stack of overlying circuitry (such as memory-plane layers), and a wiring scheme which interconnects the CMOS-layer digital circuitry with the stack of overlying circuitry. The Grove Architecture provides at least one parameterized family of solutions, allowing the following independent parameters to be varied: the number of memory-plane layers (M), the width of the crossbar (N), and a via-redundancy factor (R). For the subspace of non-redundant (R=1) instances, fully-populated "4D addressing" is provided, with $2N^2$ vias accessing $N^4$ memristors. This wiring scheme is called the "Big Bend" wiring geometry.

For the R>1 subspace, the number of vias is increased by the factor R, reducing the number of memristors accessible from each via in order to provide better read-circuit performance. For all instances in this family of solutions, there is a one-to-one correspondence between addresses and physical memory cells (memristors), and thus no holes in the address space. The 3D wiring structure is geometrically simple and provides the ability to scale the number of programmable crosspoint devices connected to each via independent of the crossbar width N and the number of layers M.

The Thicket Architecture includes an alternative wiring geometry which implements interconnections between the CMOS-layer digital circuitry and the stack of memory-plane layers in a manner which is similar to the Big Bend wiring geometry.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a diagram of an illustrative crossbar circuit (100). According to one illustrative embodiment, the crossbar circuit (100) includes an east/west array of wire segments (106) which are intersected by a north/south array of wire segments (108). Each of the east/west wire segments (106) are made up of a via (102) and a wire segment (104) which is electrically attached to the via (102). A wire segment may be a nanowire, microwire, or larger wire. Similarly, each of the north/south wire segments (108) is made up of a via (112) and a wire segment (114). For convenience, vias which are attached to east/west wire segments (106) are called east/west vias (102) and vias which are attached to north/south wire segments (108) are called north/south vias (112). At each intersection between an east/west wire segment (106) and a north/south wire segment (108), a programmable crosspoint device (110) is sandwiched between the intersecting wire segment. For example, an east/west wire segment (104) intersects a north/south wire segment (114). A programmable crosspoint device (110) is sandwiched between the east/west wire segment (104) and the north/south wire segment (114). Although the wire segments (106, 108) are illustrated as making perpendicular intersections, the wire segments (106, 108) may intersect at any nonzero angle. Saying that two wire segments intersect means that they cross, when viewed from above (not that they interpenetrate), and that they are close enough, at their point of nearest approach, to form a sandwich using an intermediate layer of switching material as the "meat" and the two crossing wire segment as the upper and lower "buns".

To write the programmable crosspoint device (110), a voltage difference or other electrical stimulus is present between the vias (102, 112). All other vias are put at an intermediate voltage. At the intersection between the wire segments (104, 114), the voltage is sufficient to change the state of the programmable crosspoint device (110), which is called the selected device. The remaining crosspoint devices (115-120) attached to either of the wire segments (104, 114) see only a portion of the full applied voltage drop because one via is at the intermediate voltage. Crosspoint devices which only see a portion of an applied voltage because they are attached to only one activated via/crossbar are called "half selected." The state of the half selected crosspoint devices (115-120) does not change because they do not see full writing voltage. The unlabeled crosspoints in FIG. 1A are the non-selected devices; both of their vias are at the intermediate voltage, and therefore there is little or no voltage drop across them, and thus their state does not change.

To read a given crosspoint device, a number of techniques can be used. According to one illustrative embodiment, a reading voltage is applied to two intersecting wire segments (104, 114). The reading voltage is sufficiently lower than the writing voltage that there is not a significant change in the state of the programmable crosspoint devices. By applying the reading voltage and measuring the amount of current which flows through the programmable crosspoint device (110) at the intersection between the wire segments (104, 114), its state can be determined. However leakage currents (122) may also flow through the half selected devices (115-120). This leakage current (122) is typically very small through each half selected device (115-120). However, these leakage currents (122) can become significant where one via (102, 112) is connected to a large number of half selected devices (115-120). In some cases, the combined leakage current (122) of the half selected devices (115-120) can be large enough that it obscures the current through the target crosspoint device (110). The proportion of the leakage current to the reading current is influenced by the ON/OFF ratio of the programmable crosspoint device, by the shape of the device's nonlinear current/voltage curve, and by the number of half selected crosspoint devices present during a give read operation. Consequently, it can be desirable to be able to scale the number of crosspoint devices attached to a given via according to the electrical characteristics of the crosspoint devices.

Figure 1B:
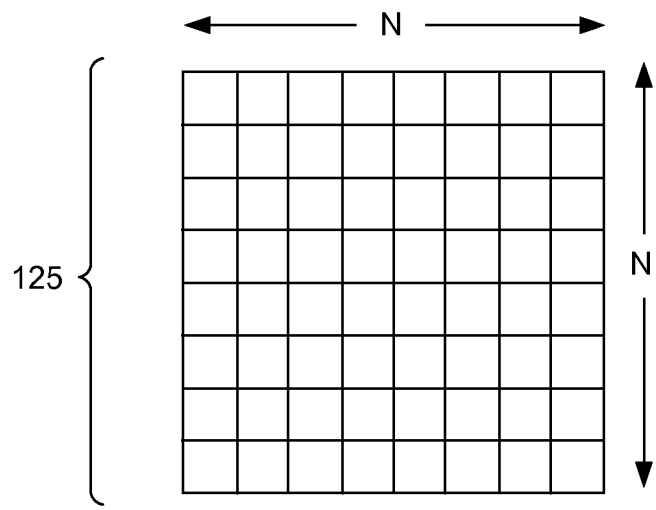
Figure 1C:
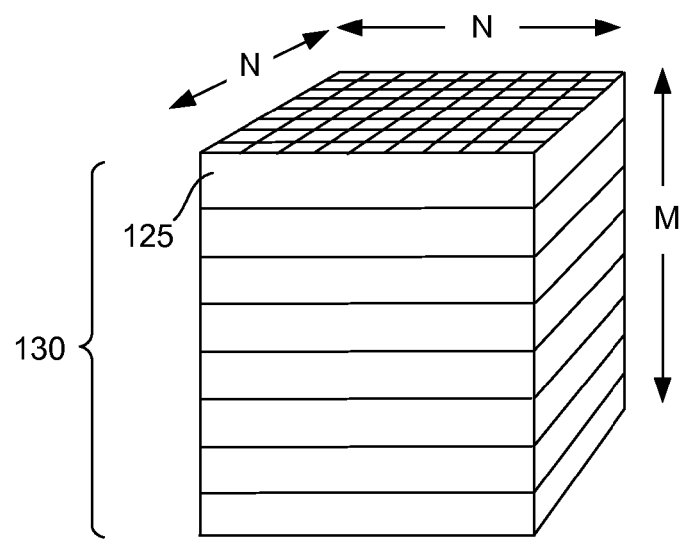

FIG. 1B is a diagram of an illustrative crossbar layer (125) which has two arrays of N nanowires, which intersect at $N^2$ crosspoints. FIG. 1C is a diagram of an illustrative crossbar stack (130) which is formed from M crossbar layers (125). As discussed below, this crossbar stack (130) can incorporate a variety of interconnection architectures such that each programmable crosspoint device is uniquely addressed and every address within a contiguous address space accesses a programmable crosspoint device.

Figure 2:
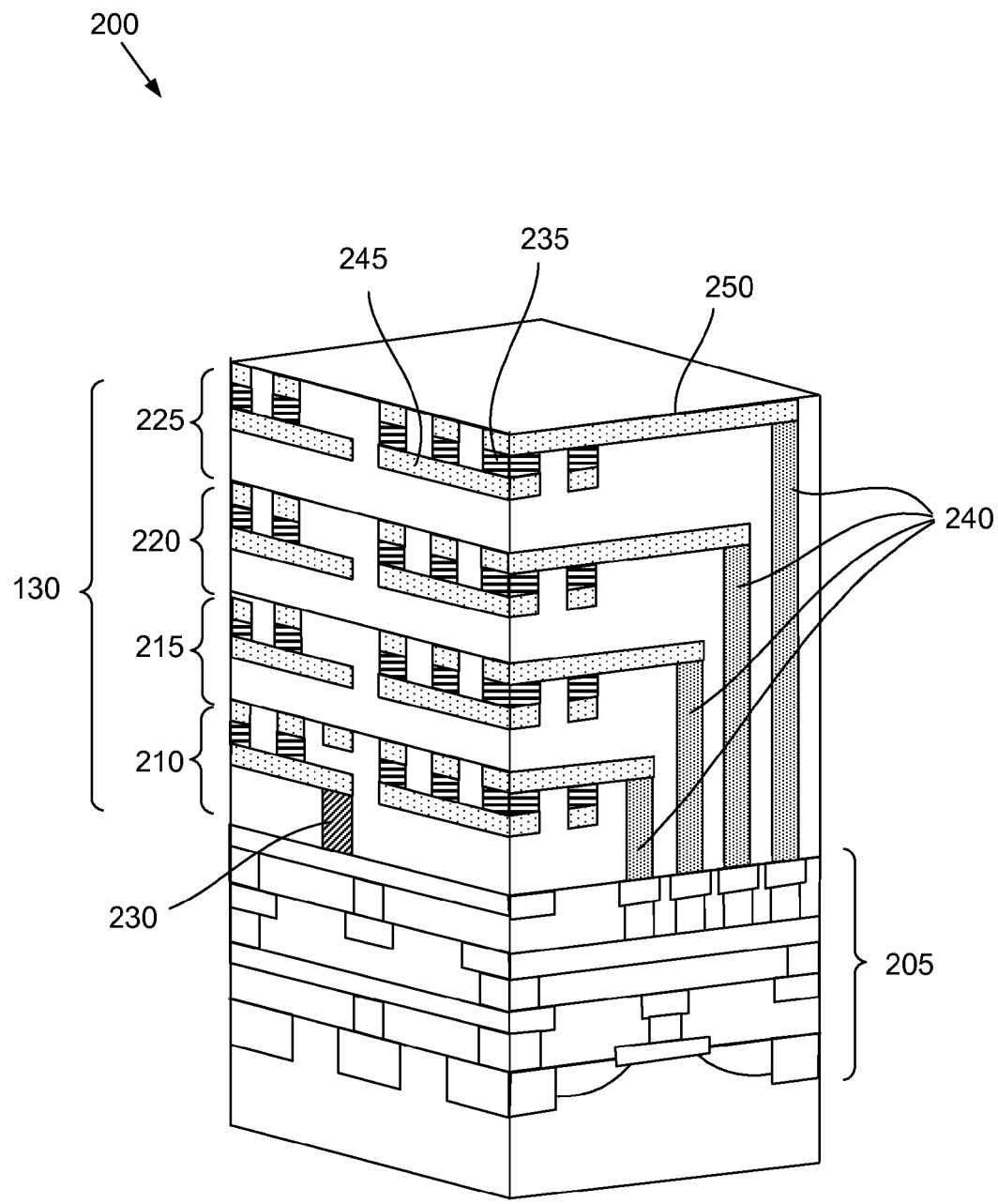
FIG. 2 is a cross-sectional diagram of an illustrative multilayer circuit which includes multiple stacked crossbar circuits, according to one embodiment of principles described herein.

FIG. 2 is a cross sectional diagram of a multilayer circuit (200) which includes a crossbar stack (130) which is formed from multiple stacked crossbar circuit layers (210, 215, 220, 225). According to one illustrative embodiment, crossbar stack (130) overlies a CMOS layer (205). A number of east/west vias (240) and north/south vias (230) provide electrical connections between the CMOS layer (205) and the programmable crosspoint devices (235) which are interposed between intersecting east/west wire segments (250) and north/south wire segments (245).

According to one illustrative embodiment, the programmable crosspoint devices (235) are memristive devices or memcapacitive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. These changing dopant configurations within a matrix produce changes in the electrical resistance or other characteristics of the device. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles. Memristive devices are described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety.

Additionally or alternatively, the programmable crosspoint devices may be memcapacitive devices. According to one illustrative embodiment, memcapacitive devices share operational similarities with memristors, except the motion of dopants within the matrix primarily alters the capacitance of the device rather than its resistance. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

According to one illustrative embodiment, the multilayer circuit (200) may be used to form a nonvolatile memory array. Each of the programmable crosspoint devices (235) may be used to represent one or more bits of data. Although the wire segments (245, 250) are shown with rectangular cross sections, wire segments (245, 250) can also have square, circular, elliptical, or more complex cross sections. The wire segments (245, 250) may also have many different widths or diameters and aspect ratios or eccentricities.

As discussed above, the crossbar stack (130) is integrated with a complimentary metal-oxide-semiconductor (CMOS) layer (205) or other conventional computer circuitry. This CMOS layer (205) can provide additional functionality to the crossbar stack (130) such as input/output functions, selection using an address, buffering, logic, or other functionality. Various three dimensional circuits which include integrated crossbar arrays are described in PCT Application No. PCT/US2009/039666, to Dmitri Strukov et al., entitled "Three Dimensional Multilayer Circuit," filed Apr. 6, 2009, which is incorporated by reference in its entirety.

Access transistors within the CMOS layer are relatively efficient switches with high ON/OFF ratios and can be used to create read circuits for the overlying crossbar stack (130). The read circuit is configured to ascertain the state of a selected memristor in the presence of leakage from many half-selected memristors in the crossbar. Since there is only one CMOS layer (205) in the multilayer circuit (200) and many crossbar layers (210, 215, 220, 225), the CMOS transistors should be carefully and efficiently utilized to access the programmable crosspoint devices. Although only four crossbar layers (210, 215, 220, 225) are shown in FIG. 2, there are strong design motivations for increasing the number of crossbar layers. For example, increasing the number of crossbar layers can increase the bit density and decrease the planar area occupied by a given component.

However, finding an acceptable interconnection wiring in the multilayer circuit (200) can be challenging. There can be a number of criteria and design goals which guide the overall design of the multilayer circuit (200). The interconnection wiring may have an influence on many aspects of the multilayer circuit design. According to one illustrative example, the following criteria and design goals can be applied to the design of a multilayer memory circuit: 1) The interconnection wiring connects multiple planes of memristor crossbar memory (stacked vertically), using only one bottom layer of CMOS circuitry. 2) The multilayer circuit design and interconnection wiring should achieve high bit density—higher than can be achieved without multiple planes. 3) The multilayer circuit design and interconnection wiring should adequately handle practical electrical engineering issues such as wire resistance, wire capacitance, leakage through non-selected and half-selected memristors, etc. 4) The multilayer circuit design should be competitive in terms of speed and power consumption. 5) The multilayer circuit design should provide read and write circuitry which is compatible with the crossbar structures, and with a range of programmable crosspoint devices including memristive devices. 6) The multilayer circuit design minimizes, to the extent possible, the number of layers, processing steps, and masks required to fabricate the multi-layer memory chip. This reduction in manufacturing complexity can reduce the cost to form the multilayer circuits. 7) The multilayer circuit design provides a memory which, as seen externally, has a one-to-one mapping between addresses and physical memory cells (memristors)—that is, a memory which is dense (there are no holes in the address space), and in which the physical bits are uniquely addressed (there are no memristors with multiple addresses, and no addresses which activate multiple memristors). As used in the specification and appended claims the term "address space" refers to a range of discrete addresses assigned to programmable crosspoint devices within a multilayer circuit. 8) The multilayer circuit design provides a memory system architecture which is compatible with the standard techniques for improving memory chip yield, such as the use of error-correcting codes (ECC) and the use of locate-and-avoid technique, which locates defects and replaces the defects with redundant resources. 9) The multilayer circuit design minimizes the overhead incurred by vias, inter-layer wiring, decoders, etc., so as to approach as closely as possible, for the global density, the inherent maximum local density of the memristive crossbar. For example, for a memristive crosspoint device, the maximum local density may be 1 bit per $(3F)^2$, where F is the minimum lithographic feature size. 10) A multilayer circuit architecture which provides a parameterized family of solutions has a number of advantages. For example, this parameterization may allow the number of crossbar layers, the number of wire segments in each crossbar, and the number of vias to be varied.

The criteria and design goals listed above are not exhaustive. Further, meeting each of the criteria and design goals is not required. A number of desirable interconnection architectures could be created which may not meet all of the criteria and design goals. Additionally, performance of the multilayer circuit in one category may be reduced to produce a resulting gain in another design category. In the examples below, it is assumed that lithographic feature size is the same for all upper crossbar layers as for the CMOS layer. However, this is not a requirement. The crossbar layers may be formed using a variety of methods which produce different and typically smaller feature sizes than conventional lithography. The principles below taught could be used in conjunction with a variety of manufacturing processes.

Further, the descriptions herein are not intended to be exhaustive or to limit these principles to any precise form disclosed. Many modifications and variations are possible in light of the above teaching. For example, the structure of the layers, the number of layers, and routing in some multilayer circuits may be significantly more complex and may require more masks and interconnections than the illustrated embodiment.

The Grove Architecture

Figure 3C:
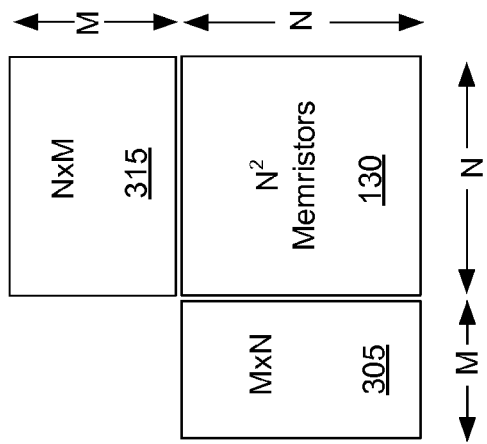
FIGS. 3A-3C are diagrams of an illustrative embodiment of a interconnection model which connects underlying Complimentary Metal-Oxide-Semiconductor (CMOS) circuitry to wire segments in a multilayer circuit, according to one embodiment of principles described herein.
Figure 3B:
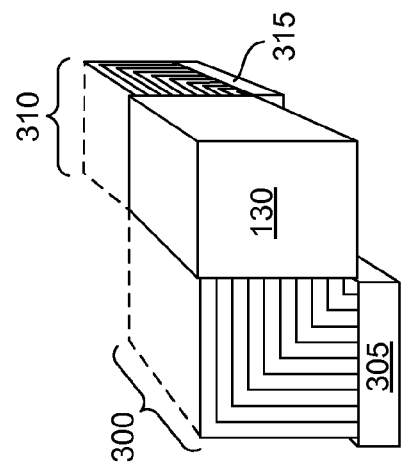
Figure 3A:
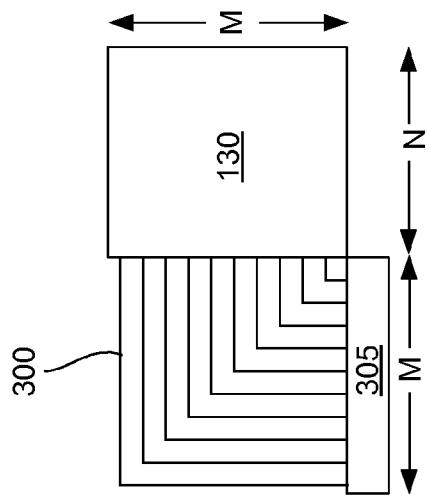

FIGS. 3A-3C show one illustrative embodiment of the Grove architecture family: the Big Bend wiring scheme. FIG. 3A is a side view of one slice of an illustrative multilayer circuit which incorporates the Big Bend wiring scheme (300). According to one illustrative embodiment, N memristors are attached to each wire segment, which results in an N×N crossbar array with $N^2$ memristors. These crossbar arrays (also called memory planes or layers) are used as a building block for the crossbar stack (130). The crossbar stack (130) includes a stack of M layers of these N×N crossbar arrays. Each layer has N north/south nanowires and N east/west nanowires, which adds up, for all M layers, to 2NM nanowires. A dedicated via for each of these 2NM nanowires is provided in the CMOS layer (205). The Big Bend wiring scheme (300) is a simple, non-overlapping wiring scheme to route a 2D array of N×M west vias coming up out of the CMOS via array (305) to M east/west wire segments coming out of the side of the crossbar stack (130). Each of the M layers of the crossbar stack (130) is an N×N crossbar array. The vias are bent 90 degrees to feed into the side of the stack of M memory planes.

FIG. 3B is a perspective view of an illustrative multilayer circuit which incorporates the Big Bend wiring scheme (300, 310). FIG. 3B shows Big Bend wiring (300, 310) which makes connections between a west CMOS 2D via array (305) and a north CMOS 2D via array (315) and the crossbar stack (130). FIG. 3C is a plan view of the west CMOS via array (305), the north CMOS via array (315), and the crossbar stack (130). In this illustrative embodiment, the crossbar stack (130) includes M layers of N×N memristors each. The CMOS via arrays (305, 315) are formed with M×N or N×M vias such that each column of N vias in the west CMOS via array (305) connect with their respective N east/west wire segments for each of the M layers. Similarly, the N vias in each row of the north CMOS via array (315) connect to their respective N north/south wire segments for each of the M layers. Consequently, by accessing one west via and one north via, a memristor is uniquely addressed for read and write operations. In the Big Bend wiring scheme, the two vias must be chosen such that they access the same layer.

The Big Bend wiring scheme (300, 310) has the following characteristics. First, the Big Bend wiring scheme (300, 310)

is a simple geometric structure which incorporates a large number of vias in order to reduce the number of memristors on each wire segment. Each of the M crossbar arrays is electrically isolated from the other layers and is accessed only from the CMOS layer (305, 315). The CMOS layer (305, 315) is being utilized relatively effectively because the access transistors in the CMOS layer are laid out in a dense 2D grid driving the upward-going vias.

According to one illustrative embodiment, the raw address for a given memristor in the M crossbar layers consists of three coordinates: Y which designates which via in the N direction in the west CMOS (305) via array is selected, X which designates which via in the E direction of the north CMOS (315) via array is selected, and Z which designates which layer within the M crossbar layers is selected. The Z coordinate is the same for both the west and the north via arrays. Thus Y, Z coordinates select an east/west wire segment connected to the specified west via and X, Z coordinates select a north/south wire segment connected to the specified north via. Only the memristor in the intersection of the east/west wire segment and the north/south wire segment is accessed for reading or writing. This is the selected memristor. Consequently, the address (X, Y, Z) uniquely address all memristors in the crossbar and there are no holes in the addressing space.

The Big Bend wiring scheme can be parameterized to reduce the size of the via arrays while still uniquely addressing the same number of programmable crosspoint devices. As discussed above, this parameterization produces a more general, flexible architecture (the Grove Architecture) which can be adapted to accommodate the electrical characteristics of a given type of programmable crosspoint device. For example, for programmable crosspoint devices which have a relatively high leakage when half selected, a relatively small number of programmable crosspoint devices are attached to a given via. This results in a larger number of vias being connected to the via arrays. For programmable crosspoint devices which have a relatively low leakage when half selected, a larger number of programmable crosspoint devices may be attached to a given via. Consequently, there would be a smaller number of vias in the via arrays, which would improve the bit-density since vias are overhead.

Figure 4A:
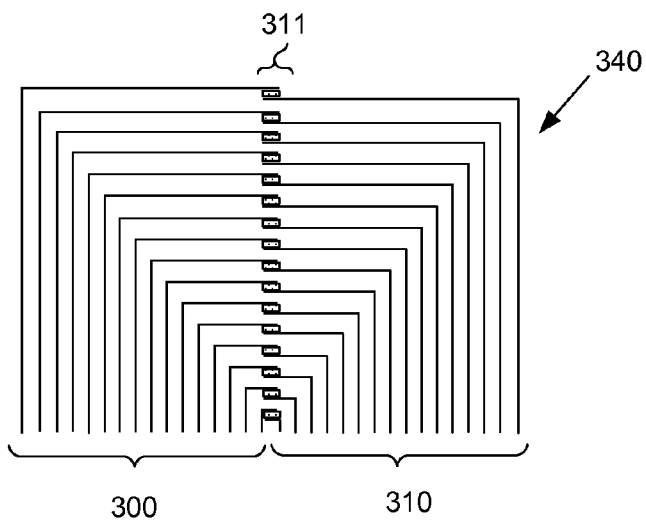
FIGS. 4A-4C are illustrative wiring schemes for accessing a multilayer crossbar array, according to one embodiment of principles described herein.
Figure 4B:
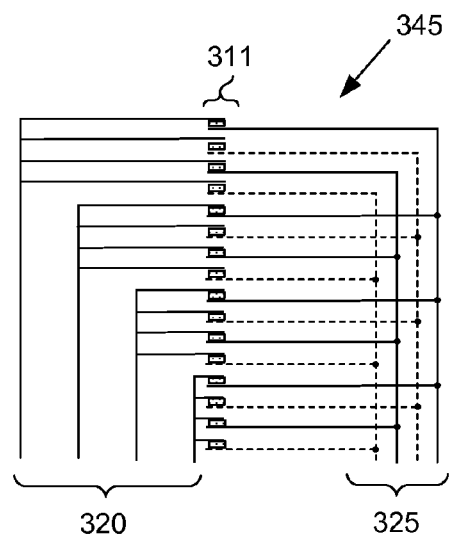
Figure 4C:
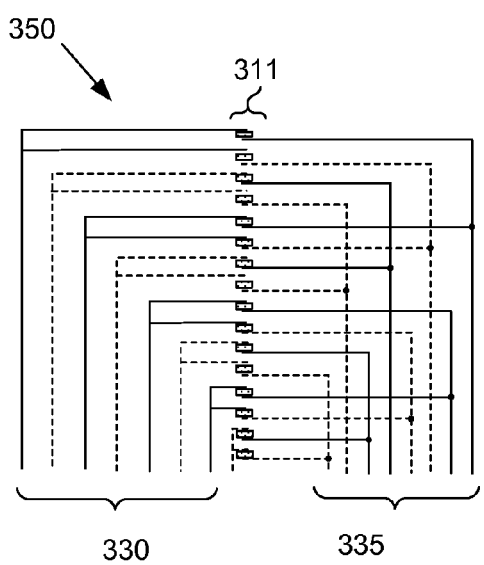

Throughout FIGS. 4A, 4B, and 4C, it is assumed that the various wiring schemes access a multilayer crossbar array with 16 layers. Each layer of the crossbar array has N×N crosspoint devices. FIG. 4A is a cross sectional view of the Big Bend wiring (340) for both west via array and the north via array. The west wiring (300) and the north wiring (310) are shown on the same plane so their interaction can be clearly illustrated and described. In the actual device, the west wiring (300) and the north wiring (310) will be in perpendicular planes. As discussed above, the N×N multilayer crossbar array has stacked 16 crossbar arrays. These 16 crossbar arrays are illustrated by 16 crosspoint devices (311) which show that the west wiring (300) connects to the upper wire segments in each crossbar array, and the north wiring (310) attaches to the lower wire segments in each crossbar array. Consequently, for the Big Bend wiring scheme (340), the via array underlying the wiring has the same number of rows as there are layers M in the multilayer crossbar array and each via is attached to N crosspoint devices in one layer of N×N multilayer crossbar array.

FIG. 4B shows a wiring scheme which drastically reduces the number of vias while still addressing the same number of crosspoint devices. This scheme is known as the Fully-Squashed Big Bend model (345) because it is synthesized by starting with the Big Bend model (340, FIG. 4A), which has the maximum number of vias, and systematically collapsing ("squashing") the wiring together so that each via drives multiple memory planes. If properly performed, the unique addressing property of the wiring architecture is preserved, while the number of vias is reduced to a minimum ("fully-squashed"). For example, the west via array (320) uses only 4 rows of vias to address the 16 layers of the multilayer crossbar circuit. To accomplish this, vias in the outer most row of the west via array (320) are wired to the upper wire segments in the top four consecutive layers. The next row of vias in the west via array (320) is similarly wired to the upper wire segments in the next four consecutive layers, and so forth for each row of vias.

The vias of the north via array (325) are not wired to consecutive layers. Instead, the vias of the north via array (325) are wired the lower wire segments to every fourth layer. For example, the outermost row of vias is wired to the uppermost layer, the $5^{th}$ layer, the $9^{th}$ layer, and the $13^{th}$ layer. Consequently, the each via in the outermost row of the north via array (325) interconnects with one via in each of the rows of vias in the west via array (320). Similarly, each of the other rows in the north via array (325) is interconnected with every row in the west via array (320). To show the connection scheme more clearly, the wiring in every other row of the north wiring (325) is illustrated using dashed lines.

In this illustrative configuration, there are only 4 rows of N vias needed to address the N×N×M array of programmable crosspoint devices and each via is connected to 4N crosspoint devices. This gives 2N vias addressing $N^2$ crosspoint devices for the each of the layers. This Fully-Squashed Big Bend wiring scheme (345) achieves fully populated 4D addressing with no holes in the address space. A fully-populated address space with no holes is an address space (a contiguous sequence of integers) in which every address has a corresponding physical memory cell, every memory cell has an address, and no memory cell has multiple addresses. A 4D address space is one in which the address can be divided into four independent sub-addresses (or coordinates), where two of the coordinates specify one wire segment which crosses the selected memristor, and the other two coordinates specify the other wire segment which crosses the selected memristor. For the Fully-Squashed Big Bend wiring scheme, the four coordinates can be seen in FIG. 5 as the two sub-addresses which are inputs to the South and West multiplexers (which select the East-West selected wire segment), and the two sub-addresses which are inputs to the North and East multiplexers (which select the North-South selected wire segment). The Fully-Squashed Big Bend wiring scheme (345) shares a number of advantages with the Big Bend model (340, FIG. 4A). Additionally, the Fully-Squashed Big Bend wiring scheme (345) reduces the duplication of vias shown in the Big Bend model (340, FIG. 4A).

FIG. 4C shows one illustrative Partially-Squashed Big Bend model (350) which falls between the fully expanded wiring scheme of the Big Bend model (340, FIG. 4A) (size of each via array is N×M for M layers) and the Fully-Squashed Big Bend model (345, FIG. 4B) (size of each via array is N×sqrt(M) for M layers). In this Partially-Squashed Big Bend model (350), there are eight rows of vias in each via array (the size of each via array is N×2*sqrt(M)). Each row of vias in the west via array (330) is connected to two rows of vias (335) in the north via array (335). To show the connection scheme more clearly, the wires in every other row of the west and north wiring (330, 335) are illustrated using dashed lines.

Generally, a number of intermediate cases can be synthesized by starting with the Big Bend model (340, FIG. 4A), which has the maximum number of vias, and systematically collapsing ("squashing") some of the wiring together so that each via drives multiple memory planes. If properly performed, the unique addressing property of the wiring architecture is preserved, while the number of vias is reduced.

To differentiate between the Big Bend (340, FIG. 4A), Fully-Squashed Big Bend (345, FIG. 4B), and the Partially-Squashed Big Bend (350, FIG. 4C) wiring schemes, a via-redundancy factor R can be used. The Fully-Squashed Big Bend (345, FIG. 4B) is used as the non-redundant base case, since it has the lowest number of vias; R is the factor by which the via-count is increased in the other cases.

Thus, for the case of M=16 layers and arbitrary-sized N×N crossbars arrays, the wiring architecture yields the following cases, with R used to distinguish them:

TABLE 1

| Wiring Scheme | Via-redundancy factor | Via arrays |
|---|---|---|
| Big Bend | R = 4 | Two groups of N×16 vias |
| Partially-Squashed Big Bend | R = 2 | Two groups of N×8 vias |
| Fully-Squashed Big Bend | R = 1 | Two groups of N×4 vias |

The above three cases are special cases of the Grove Architecture. The parameter R is limited to the range 1 to sqrt(M). So in this M=16 example, the three examples with R=1, 2 and 4 span the design space.

As another example, for the case of M=64 layers and arbitrary-sized N×N crossbars arrays, the wiring architecture yields the following cases:

TABLE 2

| Wiring Scheme | Via-redundancy factor | Via arrays |
|---|---|---|
| Big Bend | R = 8 | Two groups of N×64 vias |
| Partially-Squashed Big Bend A | R = 4 | Two groups of N×32 vias |
| Partially-Squashed Big Bend B | R = 2 | Two groups of N×16 vias |
| Fully-Squashed Big Bend | R = 1 | Two groups of N×8 vias |

Figure 5:
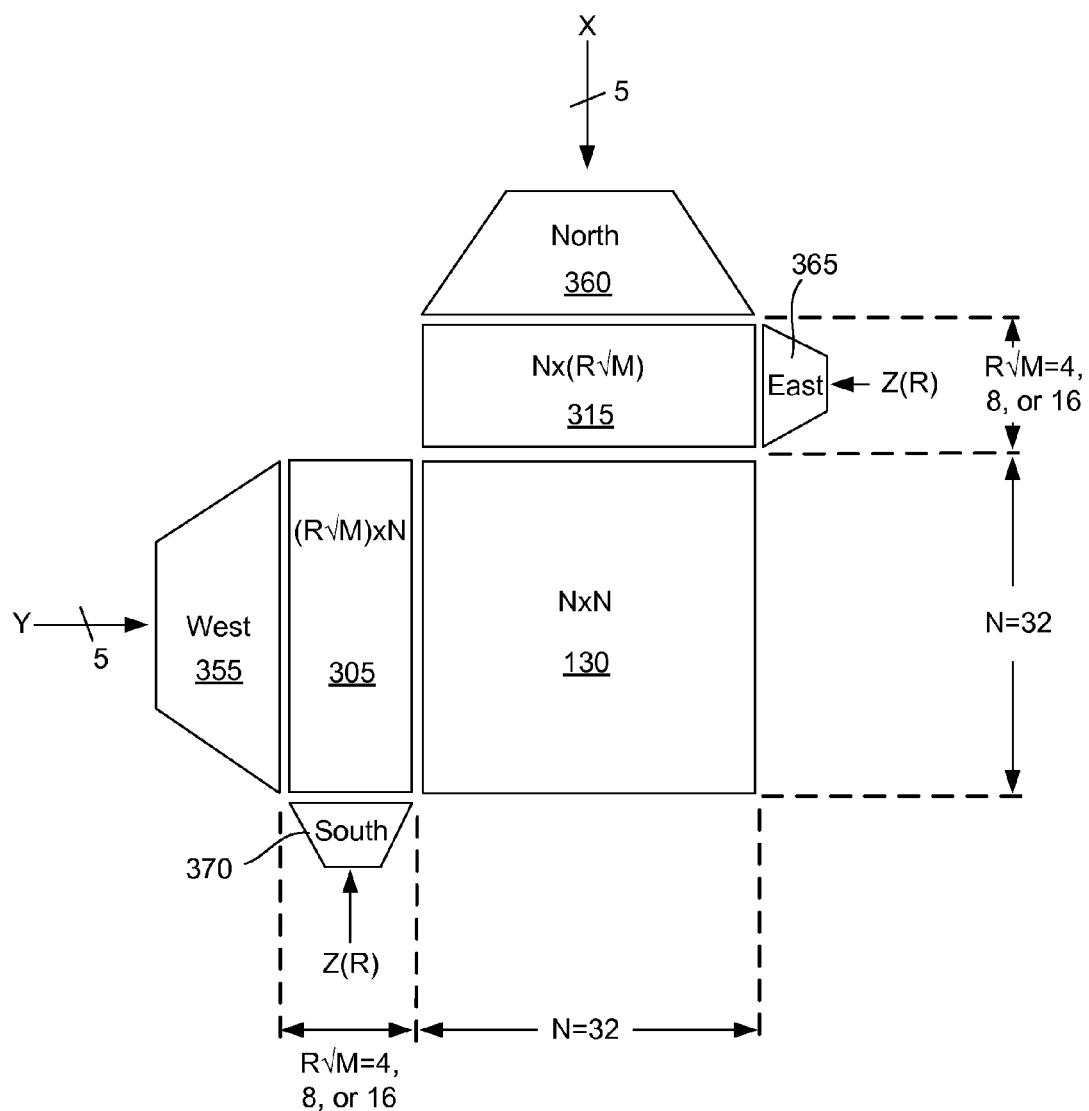
FIG. 5 is a diagram of an illustrative interconnection architecture for multilayer circuits, according to one embodiment of principles described herein.

The figures above have shown the physical wiring between the vias in the CMOS layer and the wire segments in the multilayer crossbar circuit for the Grove Architecture. FIGS. 5, 6A, 6B, 6C, and 6D show one illustrative method for addressing the vias in the various scaled wiring schemes. Throughout the following examples it is assumed that N=32 and M=16. FIG. 5 is a plan view of an N×N crossbar stack (130) and its associated north via array (315) and west via array (305). Each via array (315, 305) is addressed by two decoders which receive a portion of a binary address. According to one illustrative embodiment, the decoders (355, 360, 365, 370) may be multiplexer/demultiplexers which accept a binary input and selected a given output line based on the binary input. For example, the (R√M)×N west via array (305) is addressed by a west decoder (355) which receives a 5 bit address Y and a south decoder (370) which receives an address whose specific configuration is determined by the via redundancy factor R. Similarly, the N×(R√M) north via array (315) is addressed by a north decoder (360) which receives a 5 bit address X and an east decoder (365) which receives an address whose specific configuration is determined by the via redundancy factor R. These pairs of decoders (355, 370; 360, 365) control the 2D array of transistors in the CMOS layer which access the via arrays (305, 315). The inputs to the south and east decoders (365, 370) are represented as "Z(R)" to indicate that the inputs are a function of the via redundancy factor R.

Figure 6A:
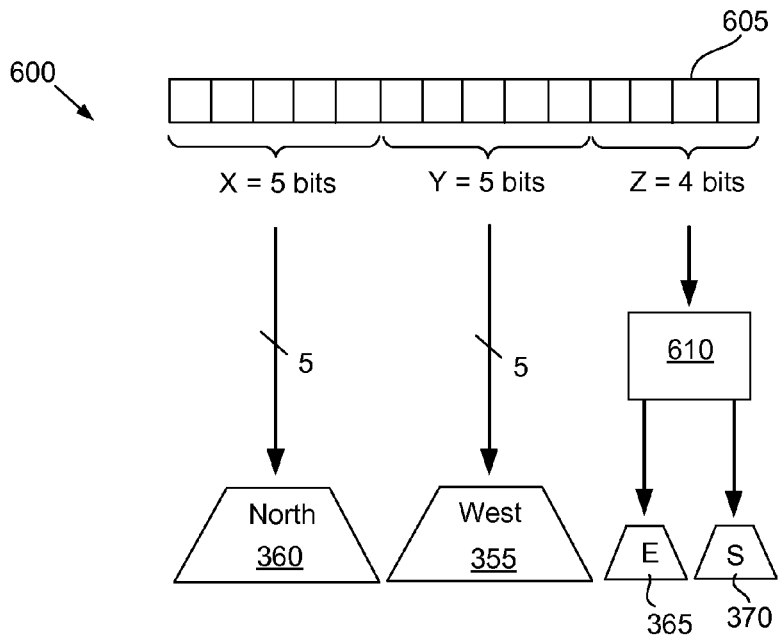
FIGS. 6A-6D show one illustrative addressing scheme for addressing the vias in the various scaled architectures, according to one embodiment of principles described herein.

FIGS. 6A-6D describe the inputs and configuration to the east and south decoders (365, 370) for various values of R. For this example, with a 32×32 crossbar layer and 16 layers, there are $2^{14}$ memristors in the multilayer crossbar array. FIG. 6A shows an illustrative addressing scheme (600) to uniquely address the $2^{14}$ memristors for various scaled wiring schemes. According to one illustrative embodiment, the external address (605) is made up of 14 bits which are represented as 14 boxes. The first five bits make up the X address, which is fed into the north decoder (360). The next five bits make up the Y address, which is fed into the west decoder (355). The remaining four bits make up the Z address, which specifies the layer in which the target memristor is located and drives the east and south decoders (365, 370) to select the appropriate vias for that layer. The east and south decoders (365, 370) are also known as "layer select decoders" because they function to select the layer of the target memristor. Each of the east and south decoders (365, 370) have R∘sqrt(M) output lines and use addresses with $\log_2$(R∘sqrt(M)) bits to correctly select these output lines.

Figure 6B:
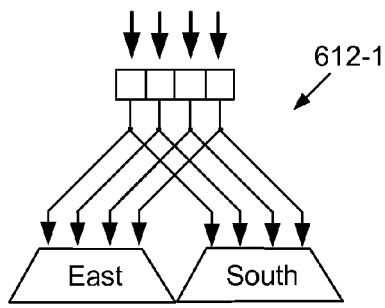
Figure 6C:
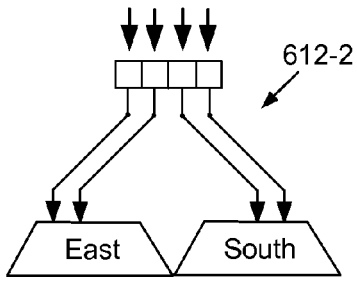
Figure 6D:
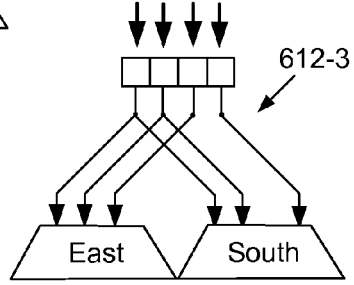

A wiring block (610) can be reconfigured to correctly route the four bits of the Z address to the correct decoder. FIGS. 6B, 6C, and 6D show illustrative examples of routing within the wiring block (610). Continuing the example described in Table 1, M=16 and R is either 1, 2, or 4 for the three cases. FIG. 6B shows routing (612-1) for the Big Bend (340, FIG. 4A) (R=4) case. All four bits are sent to both the east and south decoders, which have 16 output lines and so each need a 4-bit address. FIG. 6C shows routing (612-2) for the Fully-Squashed Big Bend (345, FIG. 4B) (R=1) case. The four bits are split up into two groups of two bits each. One 2-bit group is sent to the east decoder and the other 2 bit address is sent to the south decoder. These two decoders have only address four rows of vias and need only a 2 bit address. FIG. 6D shows routing (612-3) for the Partially-Squashed Big Bend wiring scheme (350, FIG. 4C) (R=2). The wiring is a combination of fanout (as in FIG. 6B) and splitting (as in FIG. 6C). The first two bits are fanned out to send a copy of the two bits to each decoder. The second two bits are split: one goes to the east decoder and one goes to the south decoder. Thus each decoder gets three bits of address. This is what is needed since each of these decoders address eight rows of vias for the Partially-Squashed Big Bend wiring scheme (350, FIG. 4C).

The wiring block (610, FIG. 6A) can accomplish this routing purely through making physical wiring connections between address lines and the south and east decoders (365, 370 FIG. 6A). There is no extra digital logic required. The difference between the three cases is whether one-to-one wiring is employed (called "splitting"), or whether some address bits are sent to both decoders (called "fanout"). The number of address bits sent to both decoders is $\log_2$ R. It makes sense that no address-bits are duplicated in the R=1 case (612-2, FIG. 6C), since this is the case where the upper wiring already provides non-redundant, unique addressing of the memristors.

Analysis of the Grove Architecture

As discussed above, the Grove Architecture is a parameterized family of solutions for wiring up and addressing a stack of M memory planes with an N×N memristive crossbar on each layer. The independent parameters of this family are:

M=number of layers of memory planes;
N=width of the memristive crossbar; and
R=redundancy factor for vias inserted to reduce the half-select problem.

The parameter R is limited to the range [1, sqrt(M)], with the two extremes giving the Fully-Squashed Big Bend model (R=1) and the Big Bend model (R=sqrt(M)). The factor R is the factor by which the number of vias is increased, and therefore the factor by which the number of memristors driven by each via is decreased. Thus, this architecture provides the ability to reduce the number of half-selected memristors during the read operation, independent of the crossbar width N and the number of layers M. This flexibility may be useful to adapt the architecture to a wide range of memristor types and/or to adapt to improvements memristor performance. For example, if the ON/OFF ratio of a particular memristor is improved, the number of half-selected memristors which can be tolerated when reading increases. The Grove Architecture can take advantage of this improvement by decreasing the R factor. As discussed above, decreasing the R factor decreases the number of vias and decreases the overall footprint size of the device, thus improving bit-density.

Additionally, the Grove Architecture provides a simple wiring geometry which is easily comprehensible and potentially easier to optimize. For the wiring scheme connecting to the via array 305, the wiring pattern is the same in every cross-section cut parallel to the XZ plane. Likewise, for the wiring scheme connecting the via array 315, the wiring pattern is the same in every cross-section cut parallel to the YZ plane. For example, one pair of possible wiring patterns is shown on FIG. 4A, where the left side is the wiring pattern for the via array 305 and the right side is the wiring pattern for the via array 315; alternatively, FIG. 4B another pair of wiring patterns for via arrays 305 and 315; and a third alternative pair of wiring patterns is shown in FIG. 4C. The simplicity of the design may make mistakes less likely and decrease design time. The predominance of straight lines in the vias and nanowires in the crossbars may be helpful in meeting the constraints of layout design rules, since these tend to become more restrictive at smaller feature size F. As discussed below, the overall footprint of both the layers and crossbar stack are square or rectangular, which means that multiple crossbar stacks can be packed together efficiently.

Example of the Grove Architecture

Figure 7A:
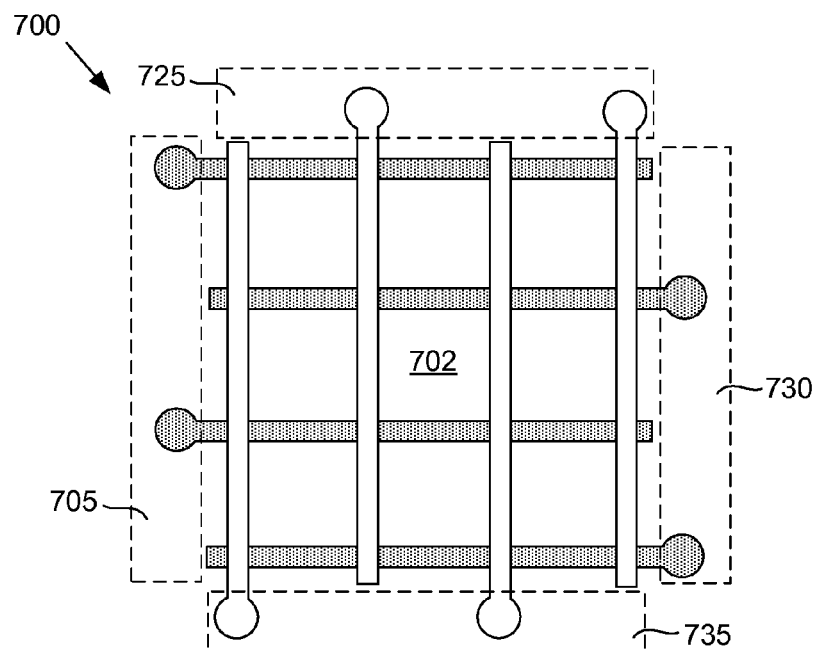
FIGS. 7A and 7B show one illustrative interconnection architecture for multilayer circuits in which vias are distributed on all four sides of a crossbar stack, according to one embodiment of principles described herein.

To provide an example of the Grove Architecture from which area and bit-density estimates can be made, an illustrative circuit with parameters M=16, N=64, and R=2 is used. Preliminary estimates of the per-via area in the CMOS layer show that the gated transistor area is $(6F)^2$, as compared with $(3F)^2$ for the area of a programmable crosspoint memory cell. To accommodate the larger area of the transistors in the CMOS layer, a Four-Sided Grove configuration can be used. FIG. 7A is a diagram which illustrates the concept of a Four-Sided Grove configuration (700). According to one illustrative embodiment, the crossbar (702) has the same basic configuration as shown in FIG. 1, with a two arrays of intersecting wire segments. The difference is that the vias for each of the arrays of wire segments are distributed on both sides of the crossbar array. For example, for the array of east/west wire segments, the vias are distributed in both a west via array (705) and an east via array (730). Similarly, for the north/south wire segments, the vias are distributed in both a north via array (725) and a south via array (735). This creates via arrays (705, 725, 730, 735) on all four sides of the crossbar (702).

Figure 7B:
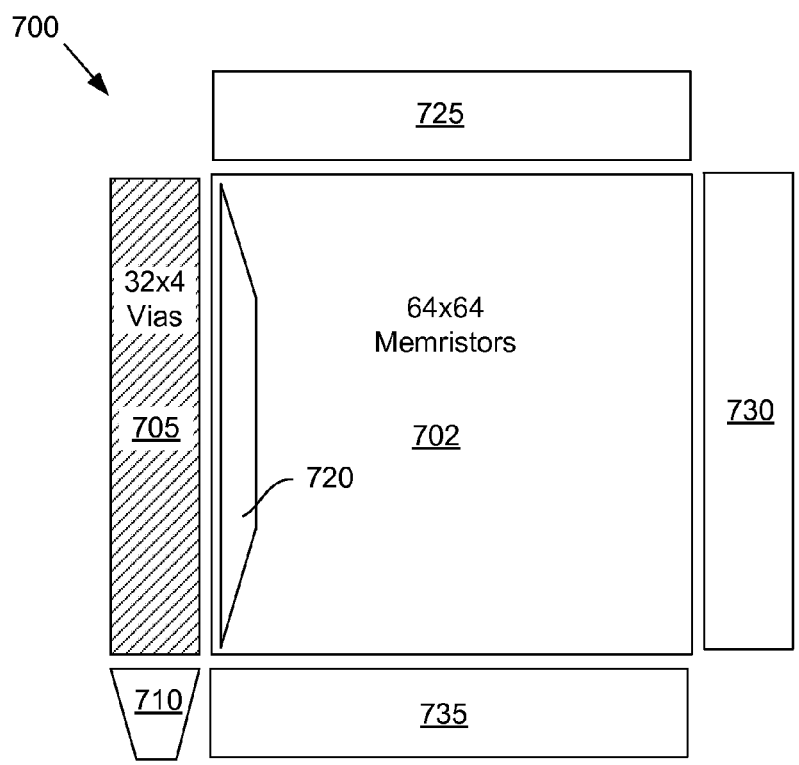

FIG. 7B shows an illustrative Four-Sided Grove architecture (700) with M=16, N=64, and R=2. The Four-Sided Grove architecture (700) includes a 64×64 crossbar stack (702) which is surrounded on four sides by 32×4 via arrays (705, 725, 730, 735). This grove contains $MN^2$=216 memristors.

There are R·sqrt(M)=8 columns of vias running north-south, and 8 rows of vias running east-west. To achieve the most compact arrangement, the various components of the Grove architecture are placed to minimize its footprint. In this illustrative embodiment, one of the decoding multiplexer/demultiplexers (720) associated with the west via array (705) can be located in a portion of the CMOS layer which is under the crossbar array (702). This CMOS area is not utilized by the overlying crossbar stack (702) and so can be advantageously used to for the multiplexers/demultiplexers or other logic or routing structures. Additionally, a multiplexer/demultiplexer (710) may be tucked into corner of the layout. This fills in the corner and gives the footprint of the Grove architecture a more uniformly square or rectangular shape which can be efficiently tiled over a surface or substrate. The decoders for the other via arrays (725, 730, 735) can be similarly situated.

The crossbar stack (702) has a width of 64×3F and each via array (705, 725, 730, 735) has a width of 4×6F, so that the width of the grove's square footprint is 240F. To get some specific area and density estimates, it is assumed that the minimum lithographic feature size, F, is 33 nm, so that a memory cell is 100 nm×100 nm and a CMOS transistor cell is 200 nm×200 nm. This results in dimensions of 8 μm×8 μm for the grove's footprint. If 1000×1000 of these groves are packed together in a single chip, the chip has dimensions of 8 mm×8 mm (area: 64 mm$^2$). Since each grove holds 64K bits, the whole chip contains 64 G bits. The bit-density is therefore approximately 100 Gbits/cm$^2$. Using M=16 layers produces a net bit-density gain of G=10, compared with the assumed single-layer maximum memristor density 10 Gb/cm$^2$=1 bit/(100 nm)$^2$. The overhead incurred by the vias is V=(8 μm/6.4 μm)$^2$=1.56. Thus, the net density improvement is G=M/V=~10.

The parameters N=64, M=16, and R=2 show that there are N·sqrt(M)/R=128 memristors being accessed by each via. The R parameter is permitted to vary within the limits of 1 to sqrt(M)=4 in the Grove model. So, depending on the performance of the memristors which are used, R can be doubled if the particular type of memristors used in the design have relatively poor in ON/OFF ratio, or halved if they are very good. These possibilities are summarized by the following table.

TABLE 3

| Wiring Scheme | Via-redundancy factor R | Overhead V | Bit-Density Gain G | # memristors per via |
| --- | --- | --- | --- | --- |
| Fully-Squashed Big Bend Model | R = 1 | V = 1.27 | G = 12.6 | 256 |
| Partially-Squashed Big Bend Model | R = 2 | V = 1.56 | G = 10.2 | 128 |
| Big Bend | R = 4 | V = 2.25 | G = 7.1 | 64 |

As discussed above, the ability to vary the R parameter provides flexibility to adapt to memristors which have varying leakage and ON/OFF ratios. As discussed above, for memristors with higher leakage and/or lower ON/OFF ratios, the R parameter can be increased, which reduces the overall number of memristors per via. This will allow the state of a selected via to be read by reducing the number of half selected vias, and consequently the amount of leakage produced during a reading operation.

Figure 7C:
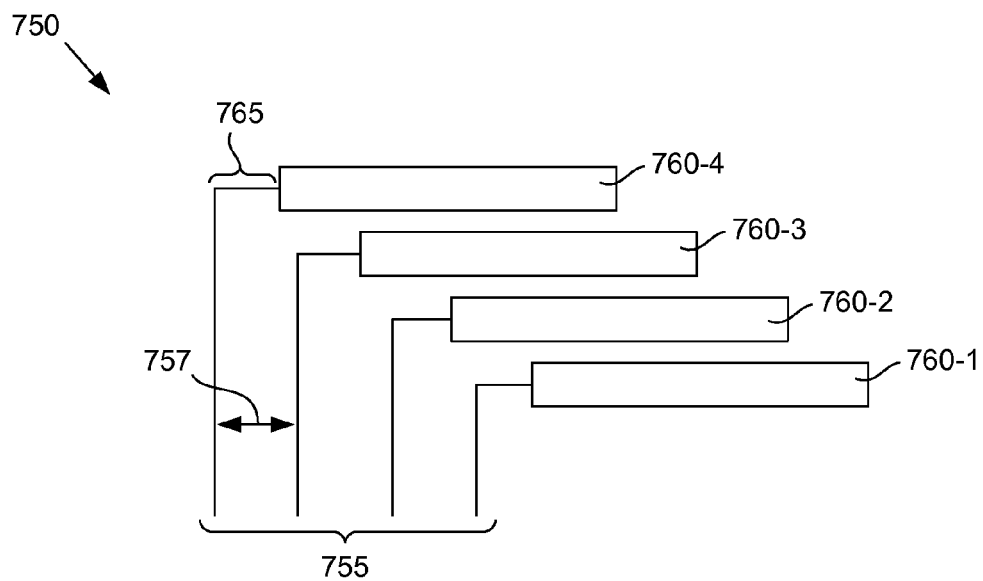
FIGS. 7C and 7D show one illustrative interconnection architecture for multilayer circuits in which crossbar layers are staggered, according to one embodiment of principles described herein.
Figure 7D:
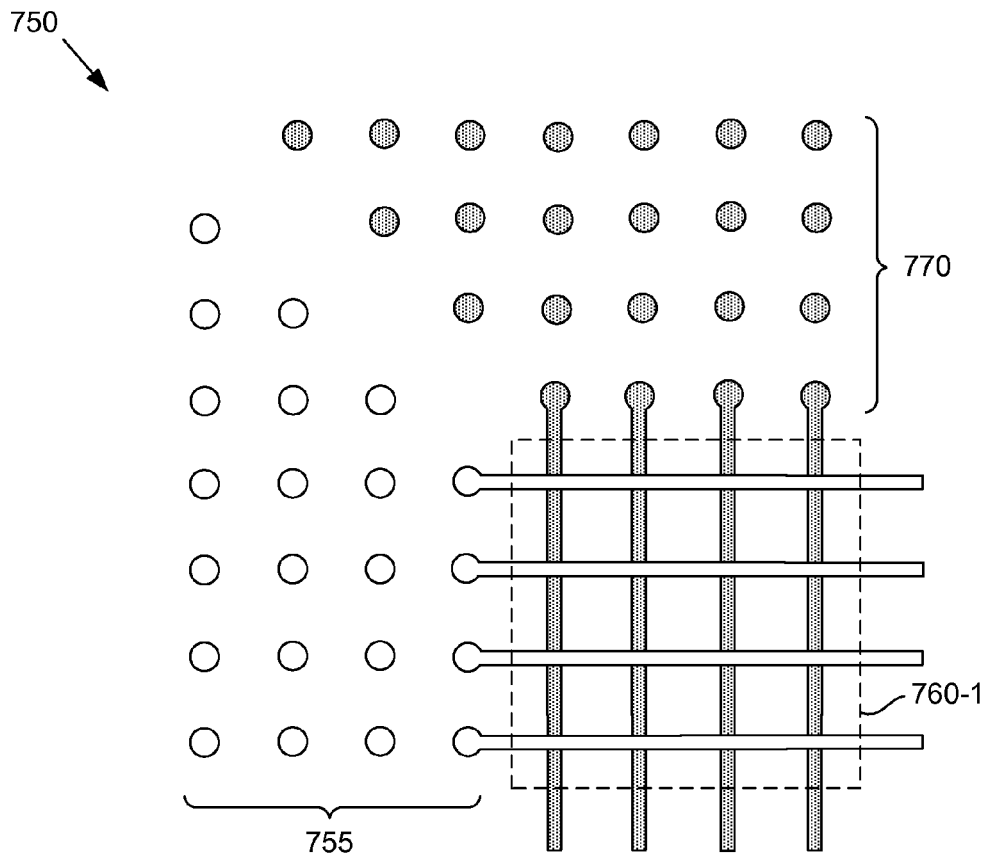

FIGS. 7C and 7D are diagrams of an illustrative optimization of the Grove Architecture which staggers the XY positions of the crossbar layers (760) slightly on each level. This results in the crossbars layers (760) having exactly the same pattern for all layers. Doing this may slightly increase the overall footprint of the architecture, but would allow for one set of masks to be used to form every crossbar layer.

FIG. 7C is a cross sectional side view of a staggered multilayer circuit wiring scheme (750) in which the crossbar layers (760) are staggered toward the left. Each of the crossbar layers (760) is shifted to the left by the via spacing distance (757). This modification of the Big Bend wiring scheme (340, FIG. 4A) ensures that the horizontal run (765) of the vias is the same for each layer (760) and allows the same masks to be used to form each of the crossbar layers (760).

FIG. 7D is a top view of a multilayer circuit showing the via arrangement for the staggered wiring scheme (750). FIG. 7D shows illustrative north and west via arrays (755, 770) which have four rows. The innermost rows of the north and west via arrays (755, 770) are connected to wire segments which intersect to form a crossbar layer (760-1). The innermost rows of vias can be selectively addressed to access programmable crosspoint devices sandwiched between the wire segments at intersections. The overlying crossbar layers will be formed in the same way and using the same set of masks to connect the outer rows of the via arrays (755, 770) to the overlying crossbar arrays.

The Thicket Architecture

The Thicket Architecture is another illustrative wiring scheme which can be used for multi-layer memristive crossbar memory. It shares several characteristics with other embodiments of the Grove Architecture family, including: 1) The thicket architecture has no holes in the address space, and therefore needs no address translator. 2) It eliminates the interlayer wiring metal layers, by using the same set of wires as both nanowires and via-translation wires.

However, there are also a number of differences between Thicket Architecture and the other embodiments of the Grove Architecture family (Big Bend, Fully-squashed Big Bend, and Partially-squashed Big Bend wiring schemes). Specifically, a portion of the vias in the Thicket Architecture are located under the crossbar stack and the electrical connections between crossbar layers zigzag upward through the interior of the crossbar stack.

Figure 8A:
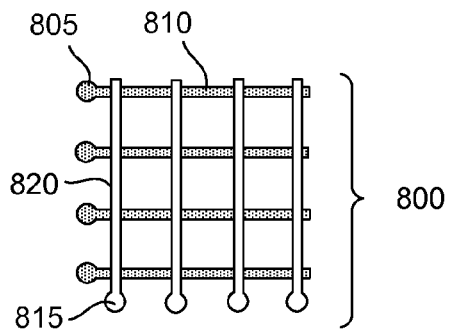
FIGS. 8A-8C are diagrams of an illustrative crossbar stack formed from a number of independent memory modules, according to one embodiment of principles described herein.

FIG. 8A shows the basic unit, or "block" (800), which is an independent memory module which has a square footprint and can be packed together efficiently. Each block (800) is a square N×N memristive crossbar array, with vias (805, 815) at the edge of the crossbar array. As discussed above, wire segments (810, 820) are connected to the vias (805, 815) and programmable crosspoint devices are sandwiched between wire segments where they intersect. According to one illustrative embodiment, each block (800) contains $N^2$ memristors, and is accessed by N east/west vias and N north/south vias. Thus, each block (800) starts with a fully populated crossbar, in which 2N vias access $N^2$ memristors.

Figure 8B:
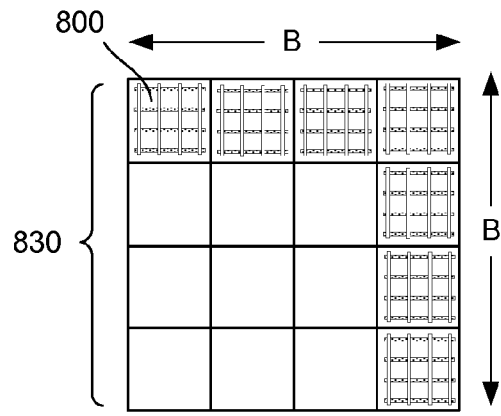

FIG. 8B shows one layer (830) of B×B blocks (800). The name "Thicket Architecture" comes from thinking of the vias as two stands of trees, whose branches interpenetrate, forming a thicket of branches. The vias on the edge are the tree trunks. The lateral nanowires (with occasional upward zigzags through short vias) are the branches. The memristors occur at intersections between the branches. For clarity, only a portion of the blocks are illustrated on the B×B grid.

Figure 8C:
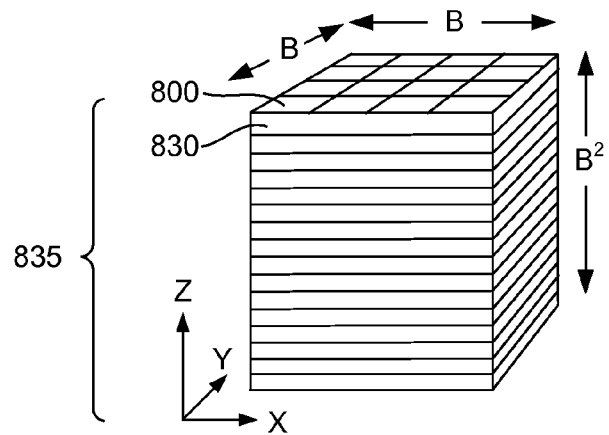

FIG. 8C shows a crossbar stack, or "thicket" (835) which is formed by stacking $M=B^2$ layers (830) to form a B×B×$B^2$ array of blocks (800). This thicket structure has a number of advantages including a straight forward geometric design which is fully populated. A variety of interconnections could be made between the blocks to connect the vias to CMOS access circuitry.

Figure 9A:
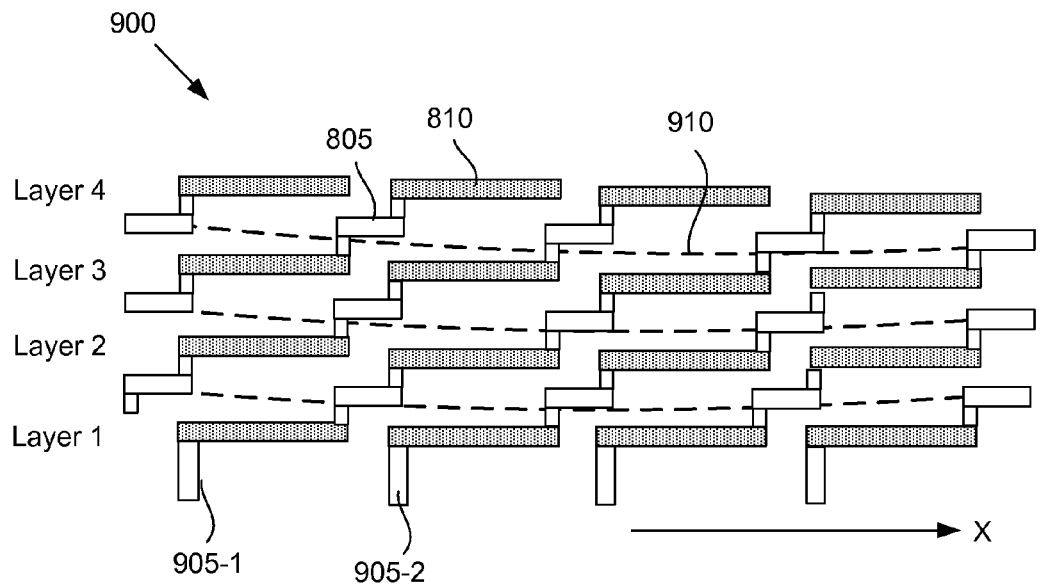
FIGS. 9A-9F show one illustrative wiring scheme which makes electrical connections to a crossbar stack, according to one embodiment of principles described herein.
Figure 9B:
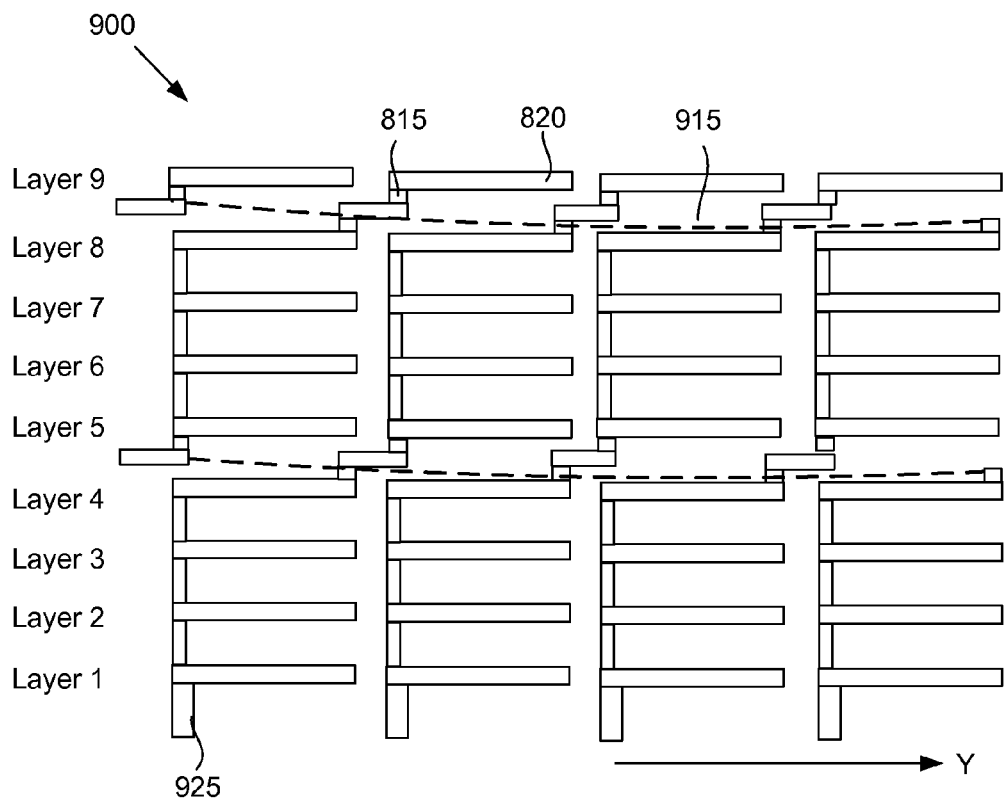

FIGS. 9A and 9B show one illustrative wiring scheme which efficiently makes electrical connections within the thicket (810) to achieve $2n \rightarrow n^2$ addressing. This wiring scheme has a "coordinate-like" simplicity with X and Y translations through the stack which are independent of one another. The X translation is restricted to the east/west crossbars, which are illustrated as shaded rectangles (810, FIG. 9A). The Y translation of the wiring occurs in the north/south crossbars which are illustrated as unshaded rectangles (820, FIG. 9B). In the thicket, the east/west crossbars (810, FIG. 9A) are perpendicular to the north/south crossbars (820, FIG. 9B) and form intersections with the north/south crossbars (820, FIG. 9B).

The wiring scheme shown in FIGS. 9A and 9B is called "circular shift" wiring. In circular shift wiring, all of the via positions are shifted in one direction by one place, then the via shifted off the end of the crossbar stack is wrapped back to the other side of the crossbar stack.

FIG. 9A is a cross sectional diagram which is a slice through the crossbar stack (835, FIG. 8C) in the XZ plane. This cross sectional diagram shows one illustrative embodiment of the circular shift wiring (900) in the X direction. The CMOS vias (905-1, 905-2) connect to the east/west crossbars (810). On the opposite end of the east/west crossbars (810), vias (805) connect the east/west crossbars (810) to east/west crossbars (810) which are up one layer and translated to the right by one position. This pattern is replicated for all layers in the crossbar stack. When a via ends at the right edge of the crossbar stack, wrap around wiring (910) connects the via from the right edge to a via on the left edge.

FIG. 9B is a cross sectional diagram of the circular shift wiring (900) through a slice of the crossbar stack (835, FIG. 8C) in the YZ plane. The X wiring shown in FIG. 9A and the Y wiring in FIG. 9B are interwoven such that the north/south wire segments (820) in the Y wiring intersect the east/west wire segments (810, FIG. 9A). As discussed above, the programmable crosspoint devices are formed at the intersections of the wire segments. In the X axis, the wiring shifts a step sideways and up each time, whereas in the Y axis, the wiring is shifted up every layer, but takes a step sideways and up only every B layers. For the example illustrated in FIGS. 8A-9B, B is equal to four and there are $B^2=16$ layers in all. For purposes of illustration only a portion of the 16 layers are shown in FIGS. 9A and 9B.

In FIG. 9B, the CMOS via (925) is connected to four different intersecting east/west wire segments (820) in each of the first four layers. The via (815) is then shifts the interconnection path to the right to the next column and intersects four more east/west wire segments (820) in the next four layers, and so forth for all 16 layers. The wrap around wiring (915) connects vias which come to the right edge of the crossbar stack to the appropriate via on the left edge of the crossbar stack.

Setting aside for the moment how the wrap around wiring is accomplished, this illustrative embodiment of the Thicket Architecture has the following properties: 1) The east/west wire segments are shifted only in the X direction, which is the direction that east/west wire segments already run. 2) The north/south wire segments are shifted only in the Y direction, which is the north/south wire segments already run. 3) For each signal emerging from an east/west via at the CMOS layer, the wiring (crossbars and vias) remains in a single plane, parallel to the XZ plane. The same is true for the north/south vias but the planes are parallel to the YZ plane. 4)

The same wiring pattern (FIG. 9A) is used in all planes driven by east/west vias, of which there are NB planes. A second wiring pattern (FIG. 9B) is used by the NB planes driven by north/south vias. 5) The X wiring is independent of the Y wiring. 6) The X wiring does not cross itself. Neither does the Y wiring.

In the Thicket Architecture, the wire segments are used for two functions: as nanowires in the memristive crossbar, and as "inter-layer wiring" to accomplish the via translation. This is done by electrically contacting the wire segments at two points, one at each end.

Figure 9C:
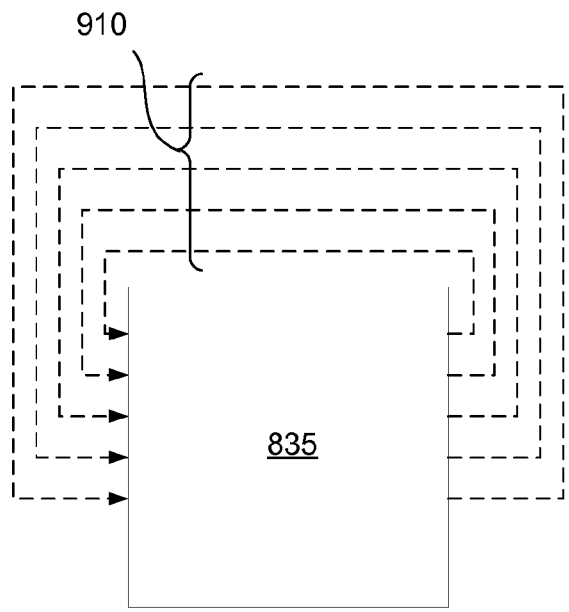
Figure 9D:
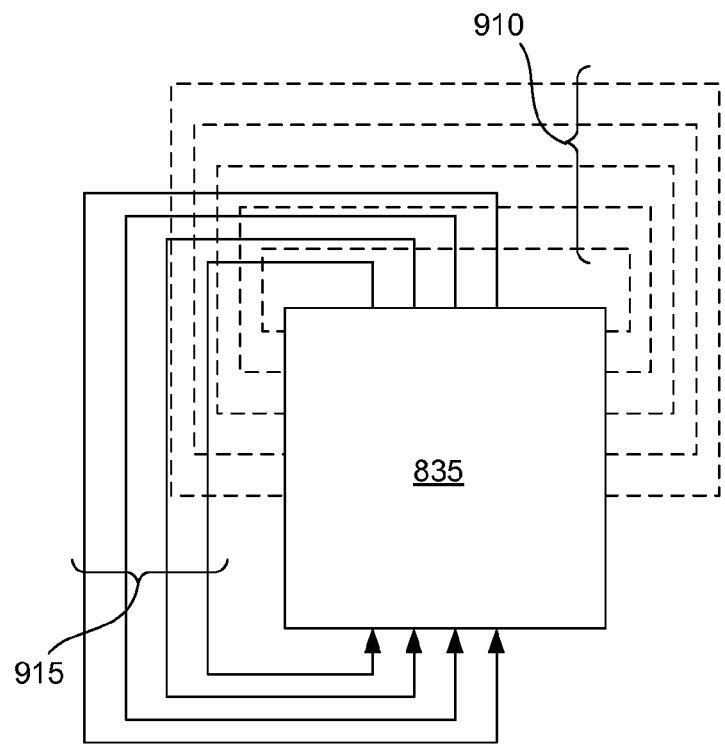
Figure 9E:
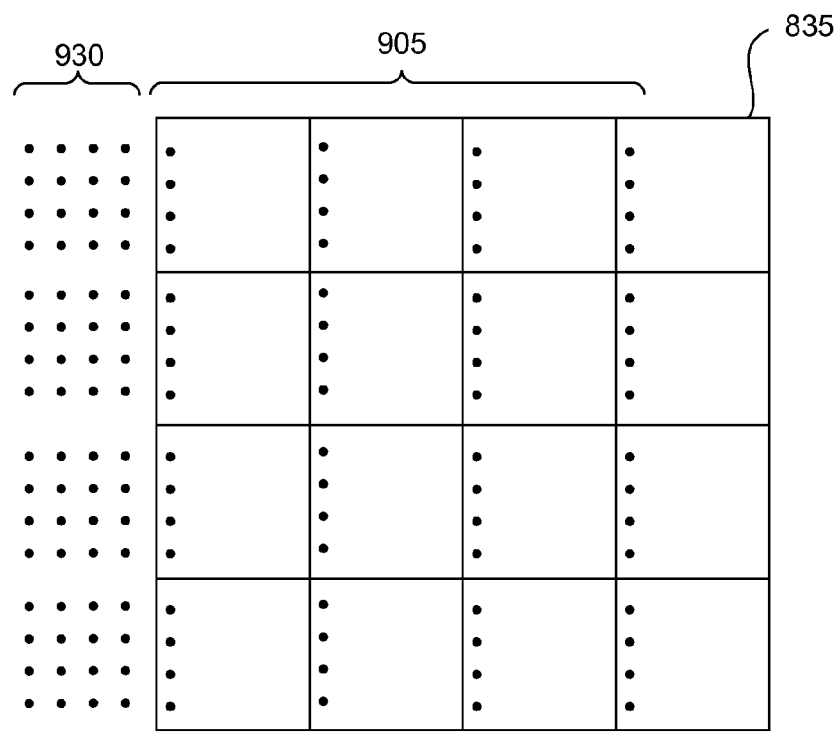

FIGS. 9C-9E are overhead-view diagrams which show illustrative wrap around wiring schemes. FIGS. 9C and 9D are diagrams of a relatively simple wiring scheme which may significantly increase the planar footprint of the device. In FIG. 9C, the east/west wrap around wiring (910) is shown exiting the crossbar stack on the right and re-entering the crossbar stack (835) on left. FIG. 9D is a diagram of the north/south wrap around wiring (915) exiting the north side of the crossbar stack (835) and re-entering the south side. This scheme is a straight forward implementation of the wrap-around wiring, but could significantly increase the planar area which the device uses. For example, this scheme for wrap-around wiring may increase the total area of the device by approximately four times the footprint of the crossbar stack (835).

Figure 9F:
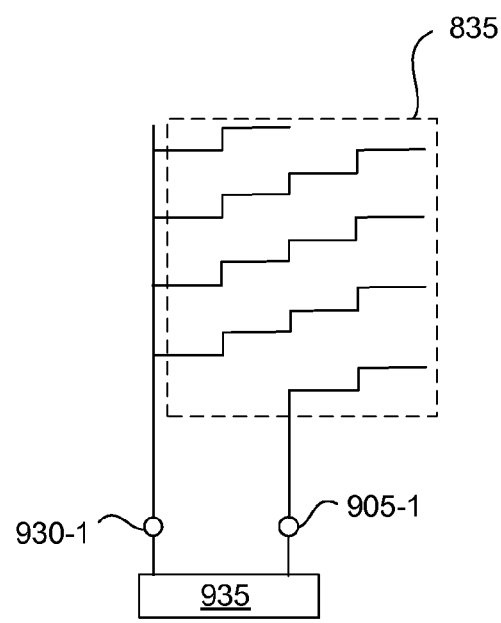

FIGS. 9E and 9F are diagrams which show an alternative wrap-around wiring scheme which is somewhat more complex, but is more space efficient. This solution provides a second source for each of the signals on all the vias beneath the crossbar by duplicating all the vias under the crossbar stack and moving this second set of vias to the perimeter of the crossbar stack. FIG. 9E shows the underlying east/west vias (905) replicated to the west of the crossbar stack (835). This produces a replicated via array (930) on the perimeter of the crossbar stack (835). The north/south vias are not shown, but are duplicated in a similar way.

FIG. 9F shows an illustrative duplicate via (930-1) which provides interconnectivity which was previously provided by the wrap around wiring. According to one illustrative embodiment, both the replicated via (930-1) and the original via (905-1) are connected to the same CMOS gate transistor (935). The underlying east/west via (905-1) connects to two east/west wire segments and then encounters the right edge of the crossbar stack (835). The replicated via (930-1) then provides the interconnectivity through the remainder of the crossbar stack (835). Since there are B wrap-arounds in X wiring, the duplicate east/west vias will get tapped B times (in this example B=4). For the Y-axis wiring, there are fewer wrap-arounds, so the duplicate north/south vias will get tapped only once each.

Assuming that the vias have the same footprint as memristors $(3F)^2$, adding the replicated vias (930, FIG. 9E) increases the width of the thick architecture from B(N+1) to B(N+2). For example, if N=32, this amounts a 3% increase in width in both X and Y—about a 6% increase in footprint area.

For the X-wiring, what was formerly a single, long, wrapped around wire has been replaced by a branching structure. This could beneficially reduce the electrical resistance between the CMOS driver and the memristor being accessed.

The Thicket Architecture as described in FIGS. 9A, 9B, 9E, and 9F has the following characteristics and advantages. The foundational element is an N×N block with $2N \rightarrow N^2$ addressing. These blocks are arranged in layers, with each layer having a B×B block footprint. The crossbar stack or "thicket" is formed with $B^2$ layers. The thicket contains $B^4N^2$ programmable crosspoint devices which are uniquely addressable by $4B^2N$ vias. Each gated CMOS transistor is connected to two vias (an underlying via and a duplicated via) and accesses $B^2N$ memristors.

As an example, let N=32 and B=4. This gives $M=B^2=16$ memory planes. Each memory plane consists of 16 blocks of 1K bits each, for a per-plane total of 16K bits. All 16 planes therefore contain 256K bits. The CMOS-level vias each are connected to $B^2N=512$ programmable crosspoint devices. This means there would be ~512 half-selected memristors which have the potential to create read-noise through their leakage currents during a read operation.

In sum, the Grove Architecture is a surprisingly simple wiring and addressing scheme for multi-layer crossbar circuits. According to one embodiment, the architecture has three independent parameters: the number of layers of memory planes M, the width of the crossbar N, and the via-redundancy factor R. This scheme uses a simple geometry with square N×N crossbars, stacked with M layers on top of one another to make a simple box-like structure. This simple geometry guarantees there are no holes in the address space, and that every memristor is addressed uniquely.

The R=1 subspace of the space of solutions (the Big Bend subspace) provides fully-populated, non-redundant 4D addressing. Increasing the via-redundancy factor R results in fewer programmable crosspoint devices per via, which is a valuable option for making a better-performing read circuit and provides flexibility to incorporate a wide variety of programmable crosspoint device types into the multilayer crossbar circuit.

The Thicket Architecture also provides fully-populated, non-redundant 4D addressing without using an interlayer wiring. The Thicket Architecture uses a straight forward wiring scheme to interconnect 2N vias and $N^2$ memristors.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An interconnection architecture for multilayer circuits comprising:
   an array of vias;
   a CMOS layer configured to selectively access the array of vias according to an address;
   a crossbar stack comprising layers of intersecting wire segments with programmable crosspoint devices interposed between intersecting wire segments;
   in which the array of vias is connected to the wire segments such that each programmable crosspoint device is uniquely addressed and every address within a contiguous address space accesses a programmable crosspoint device.

2. The architecture of claim 1, in which at least one array of vias is distributed on the periphery of the crossbar stack and electrical connections between the at least one array of vias and the wire segments extend vertically upward from the at least one array of vias and then bend horizontally to connect to wire segments in at least one layer of the crossbar stack.

3. The architecture of claim 1, in which the there are M layers in the crossbar stack, the crossbar stack is N programmable crosspoint devices wide, and the number of programmable crosspoint devices attached to each via is altered by adjusting a via redundancy factor, R, where R is a number between one and the square root of M, in which the number of programmable crosspoint devices attached to each via is greatest when R is equal to one and becomes smaller R increases.

4. The architecture of claim 3, in which the interconnection architecture includes a Big Bend wiring scheme, the Big Bend wiring scheme being configured such that 2NM vias uniquely address $N^2M$ programmable crosspoint devices and R is equal to the square root of M.

5. The architecture of claim 3, in which the interconnection architecture includes a Fully-Squashed Big Bend wiring scheme, the Fully-Squashed Big Bend wiring scheme being configured such that 2(N×sqrt(M)) vias uniquely address $N^2M$ programmable crosspoint devices and R is equal to one.

6. The architecture of claim 3, in which the interconnection architecture includes a Partially-squashed Big Bend wiring scheme being configured such that between RNM and R(N×sqrt(M)) vias uniquely address $N^2$ programmable crosspoint devices and R is equal to a number between one and the square root of M.

7. The architecture of claim 1, further comprising multiplexers/demultiplexers which are configured to accept and decode an address to uniquely address a programmable crosspoint device.

8. The architecture of claim 7, further comprising a wiring block, the wiring block allocating a portion of an address between two layer select multiplexer/demultiplexers according to the via redundancy factor R.

9. The architecture of claim 1, in which each layer is electrically isolated from the other layers and is only accessed from the CMOS layer.

10. The architecture of claim 1, in which the programmable crosspoint devices are memristors.

11. The architecture of claim 1, in which the CMOS layer addresses the vias using access transistors, the access transistors being disposed within the CMOS layer in 2D grid at the perimeter of the crossbar stack.

12. The architecture of claim 1, in which vias are distributed around all four sides of the crossbar stack.

13. The architecture of claim 1, in which the crossbar layers are staggered such that all crossbar layers are configured to be formed using the same set of masks.

14. The architecture of claim 1, in which vias underlying the crossbar stack are replicated to form a redundant via array at the perimeter of the crossbar stack, in which each via/redundant via pair is connected in a regular stepwise manner to at least one wire segment in each crossbar layer.

15. A multilayer memory circuit comprising:
a crossbar stack comprising layers of intersecting wire segments with programmable memristive devices interposed between intersecting wire segments;
an array of vias distributed on the perimeter of the crossbar stack, the number of vias within the array of vias being selected according a via redundancy factor, the array of vias being connected to at least a portion of the wire segments; and
decoders configured to accept an address and selectively activate vias with the via array according to the address;
in which each programmable memristive device is uniquely addressed and every address within a contiguous address space accesses a programmable memristive device.

* * * * *

UNITED STATES PATENT AND TRADEMARK OFFICE
CERTIFICATE OF CORRECTION

PATENT NO.        : 7,982,504 B1                                           Page 1 of 1
APPLICATION NO.   : 12/696361
DATED             : July 19, 2011
INVENTOR(S)       : Warren Robinett It is certified that error appears in the above-identified patent and that said Letters Patent is hereby corrected as shown below:

In column 16, line 62, in Claim 3, before "there" delete "the".

Signed and Sealed this
Twenty-ninth Day of November, 2011

David J. Kappos
*Director of the United States Patent and Trademark Office*